US009256130B2

(12) United States Patent
Mo et al.

(10) Patent No.: US 9,256,130 B2
(45) Date of Patent: Feb. 9, 2016

(54) METHOD FOR MANUFACTURING LIGHT-SHIELDING MASK FOR CURING CELL SEALANT

(71) Applicant: Shenzhen China Star Optoelectronics Technology Co., Ltd., Shenzhen, Guangdong (CN)

(72) Inventors: Chaode Mo, Shenzhen (CN); Chunliang Lee, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 179 days.

(21) Appl. No.: 14/235,392

(22) PCT Filed: Oct. 18, 2013

(86) PCT No.: PCT/CN2013/085507
§ 371 (c)(1),
(2) Date: Jan. 27, 2014

(87) PCT Pub. No.: WO2015/054905
PCT Pub. Date: Apr. 23, 2015

(65) Prior Publication Data
US 2015/0331321 A1 Nov. 19, 2015

(30) Foreign Application Priority Data
Oct. 15, 2013 (CN) .......................... 2013 1 0483206

(51) Int. Cl.
*G03F 1/38* (2012.01)
*G03F 7/16* (2006.01)
(Continued)

(52) U.S. Cl.
CPC .............. *G03F 7/16* (2013.01); *G02F 1/1339* (2013.01); *G03F 1/00* (2013.01); *G03F 1/38* (2013.01);
(Continued)

(58) Field of Classification Search
CPC ............... G03F 1/42; G03F 1/44; G03F 1/48; G03F 1/76; G03F 1/80; G03F 7/16; G03F 7/20; G03F 7/26; G03F 1/00; G03F 1/38; G02F 1/1339
USPC ............................................... 430/5; 349/153
See application file for complete search history.

(56) References Cited

U.S. PATENT DOCUMENTS

2003/0147040 A1* 8/2003 Park ...................... G02F 1/1339
349/187
2009/0148782 A1 6/2009 Kono et al.
(Continued)

FOREIGN PATENT DOCUMENTS

CN 101986206 A 3/2011
CN 102520590 A 6/2012
(Continued)

*Primary Examiner* — John A McPherson
(74) *Attorney, Agent, or Firm* — Andrew C. Cheng

(57) ABSTRACT

The present invention provides a method for manufacturing a light-shielding mask for curing a sealant, including the following steps: step 1: providing a transparent substrate (20); step 2: sequentially forming a metal layer (22) and a photoresist layer (24) on the transparent substrate (20); Step 3: carrying out exposure on an edge of the photoresist layer (24) to form an inspection mark (242); step 4: subjecting the photoresist layer (24) to exposure along a predetermined trace by adopting an edge exposure process, wherein the predetermined trace corresponds to a predetermined trace of a sealant to be formed in a liquid crystal display panel; step 5: removing the exposed portion of the photoresist layer (24) to expose the metal layer (22); step 6: subjecting the exposed portion of the metal layer (22) to etching and removing the unexposed portion of the photoresist layer (24); and step 7: forming a transparent protection layer (26) on the metal layer (22) and the transparent substrate (20). The present invention uses an edge exposure process to achieve exposure of the photoresist layer so that no specific masking plate is needed and the number of masking plates prepared can be effectively reduced, thereby reducing the cost the material for manufacture.

14 Claims, 5 Drawing Sheets

(51) Int. Cl.
*G03F 7/20* (2006.01)
*G03F 7/26* (2006.01)
*G03F 1/44* (2012.01)
*G03F 1/42* (2012.01)
*G02F 1/1339* (2006.01)
*G03F 1/00* (2012.01)
*G02F 1/13* (2006.01)

(52) U.S. Cl.
CPC .. *G03F 1/42* (2013.01); *G03F 1/44* (2013.01); *G03F 7/20* (2013.01); *G03F 7/26* (2013.01); *G02F 1/1303* (2013.01); *G02F 2202/28* (2013.01)

(56) References Cited

U.S. PATENT DOCUMENTS

2012/0141925 A1   6/2012  Kim et al.
2013/0316269 A1*  11/2013  Ye .............................. G03F 1/00
                                                                 430/5

FOREIGN PATENT DOCUMENTS

| CN | 102692815 A | 9/2012 |
| CN | 102736323 A | 10/2012 |
| CN | 103246154 A | 8/2013 |
| JP | 55-059722 A * | 5/1980 |

* cited by examiner

METHOD FOR MANUFACTURING LIGHT-SHIELDING MASK FOR CURING CELL SEALANT

BACKGROUND OF THE INVENTION

1. Field of the Invention

The present invention relates to the field of displaying, and in particular to a method for manufacturing a light-shielding mask for curing a cell sealant.

2. The Related Arts

A cell sealant is an adhesive used in a liquid crystal display panel for bonding two glass substrates of a thin-film transistor array substrate and a color filter substrate to prevent a liquid crystal material filled between the two glass substrate from leaking out. Referring to FIG. 1, a schematic view is given to show the structure of a conventional liquid crystal display pane, in which a cell frame 100 is formed by curing a cell sealant.

A conventional process first forms spacers on a surface of an alignment film and then uses the cell sealant to bond the glass substrates to form an empty liquid crystal cell. Later, with the size of the panel changing in a direction toward enlarged ones, the percentage of application of ODF (One Drop Filling) process is increased so that certain changes are made on the manufacturing process and the properties of the cell sealant also change.

The cell sealants are generally divided into two types, namely heat curing sealants and UV (Ultra-Violet) curing sealants. The conventional ODF process generally use the UV curing sealants. Due to the fact that the ODF processes are commonly adopted in new manufacturing lines, the UV curing sealants would become the main-stream sealants. The components of a UV curing sealant includes a photo initiator and a UV bonding agent. When the photo initiator absorbs UV, the photo initiator is caused to generate free radicals and cation reactive radicals. These free radicals or cation radicals, which are generally of high reactivity, may participate in chain extension reactions with acrylic unit or epoxy unit and the corresponding oligomers that are contained in the composition. Since the reactivity of the free radical reaction or the cation radical reaction is very fast, these reactants can complete the reaction in few seconds to few minutes and a polymer having desired properties is formed. The characteristics of the UV bonding agent may initiate a chemical chain reaction through the radiation of UV light in order to cure the sealant. A cured bonding substance can be formed in few seconds.

By irradiating UV light on the entirety of a liquid crystal display panel would result in property variation of some material components that constitute the panel and the performance of the material is affected so that, eventually, the quality and yield rate of the liquid crystal display panel are affected. Thus, it is a common practice that UV irradiation and UV curing are selectively applied to the sealant and light is shielded with a light-shielding plate in the area where no UV irradiation is necessary. Such a function can be realized with a light-shielding mask. Referring to FIG. 2, a light-shielding mask generally comprises: a pattern section 300 and a light-shielding section 500 set along an outer circumference of the pattern section 300. To carry out UV curing of the sealant of a liquid crystal display panel, UV light is allowed to pass through the pattern section 300 to irradiate the sealant to cure the sealant, while the light-shielding section blocks out the UV light, preventing the UV light from irradiating other materials of the liquid crystal display panel and causing variation of properties of the materials.

The location where the sealant may be applied is different for liquid crystal display panels of different sizes and different models. This makes it necessary to provide light-shielding plates of different sizes and different models to correspond to liquid crystal display panels of different sizes and different models.

Referring to FIGS. 3-6, a conventional process for manufacturing a light-shielding mask for curing a sealant is generally as follows. A metal layer 702 and a photoresist layer 704 are first coated on a substrate 700. Then, a masking plate 750 is applied to form a predetermined pattern on the photoresist layer 704 through exposure. Development, etching, and photoresist peeling are then carried out. Finally, a non-metallic protection layer 706 is coated on the pattern so formed. In this process, for exposure of the photoresist layer 704, the masking plate 750 must be provided with a pattern that is exactly the same as the predetermined pattern to be formed. This makes it necessary to provide different masking plates for manufacturing light-shielding masks of different sizes and different models for curing sealants. In other words, for each side and each model of the light-shielding plate for curing a sealant, there must be at least one masking plate corresponding thereto so that the manufacture cost is high and unified management may not be suitable.

SUMMARY OF THE INVENTION

An object of the present invention is to provide a method for manufacturing a light-shielding mask for curing a sealant, which has a simple process and a reduced cost.

To achieve the above object, the present invention provides a method for manufacturing a light-shielding mask for curing a sealant, which comprises the following steps:

(1) providing a transparent substrate;

(2) sequentially forming a metal layer and a photoresist layer on the transparent substrate;

(3) carrying out exposure on an edge of the photoresist layer to form an inspection mark;

(4) subjecting the photoresist layer to exposure along a predetermined trace by adopting an edge exposure process, wherein the predetermined trace corresponds to a predetermined trace of a sealant to be formed in a liquid crystal display panel;

(5) removing the exposed portion of the photoresist layer to expose the metal layer;

(6) subjecting the exposed portion of the metal layer to etching and removing the unexposed portion of the photoresist layer; and (7) forming a transparent protection layer on the metal layer and the transparent substrate.

The transparent substrate is a glass substrate.

The metal layer is formed on the transparent substrate through physical vapor deposition.

The photoresist layer is formed on the metal layer through coating.

Step (3) comprises: providing a UV light source, a masking plate, and a shielding plate, wherein the masking plate comprises a pattern zone and a marking zone located outside the pattern zone and the shielding plate is arranged under the pattern zone so that UV light emitting from the UV light source transmits through the pattern zone and irradiates the shielding plate and the UV light emitting from the UV light source transmits through the marking zone to irradiate the photoresist layer on the transparent substrate so as to subject the photoresist layer to exposure.

Step (4) comprises: providing edge exposure facility and carrying out exposure of the photoresist layer along the predetermined trace.

The edge exposure facility comprises an edge exposure device.

The etching used comprises one of dry etching and wet etching or a combination thereof.

The transparent protection layer is made of a non-metallic material.

The transparent protection layer is formed through chemical vapor deposition.

The present invention also provides a method for manufacturing a light-shielding mask for curing a sealant, which comprises the following steps:

(1) providing a transparent substrate;

(2) sequentially forming a metal layer and a photoresist layer on the transparent substrate;

(3) carrying out exposure on an edge of the photoresist layer to form an inspection mark;

(4) subjecting the photoresist layer to exposure along a predetermined trace by adopting an edge exposure process, wherein the predetermined trace corresponds to a predetermined trace of a sealant to be formed in a liquid crystal display panel;

(5) removing the exposed portion of the photoresist layer to expose the metal layer;

(6) subjecting the exposed portion of the metal layer to etching and removing the unexposed portion of the photoresist layer; and (7) forming a transparent protection layer on the metal layer and the transparent substrate;

wherein the transparent substrate is a glass substrate;

wherein the metal layer is formed on the transparent substrate through physical vapor deposition;

wherein the photoresist layer is formed on the metal layer through coating;

wherein step (3) comprises: providing a UV light source, a masking plate, and a shielding plate, wherein the masking plate comprises a pattern zone and a marking zone located outside the pattern zone and the shielding plate is arranged under the pattern zone so that UV light emitting from the UV light source transmits through the pattern zone and irradiates the shielding plate and the UV light emitting from the UV light source transmits through the marking zone to irradiate the photoresist layer on the transparent substrate so as to subject the photoresist layer to exposure; and wherein step (4) comprises: providing edge exposure facility and carrying out exposure of the photoresist layer along the predetermined trace.

The edge exposure facility comprises an edge exposure device.

The etching used comprises one of dry etching and wet etching or a combination thereof.

The transparent protection layer is made of a non-metallic material.

The transparent protection layer is formed through chemical vapor deposition.

The efficacy of the present invention is that the present invention provides a method for manufacturing a light-shielding mask for curing a sealant, which uses an edge exposure process to subject the photoresist layer to patternized exposure along a predetermined trace so that no specific masking plate is needed and the number of masking plates prepared can be effectively reduced, thereby reducing the cost the material for manufacture. Further, due to the number of the masking plates is reduced, unified management and warehousing can be realized and costs of management and warehousing can be reduced.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
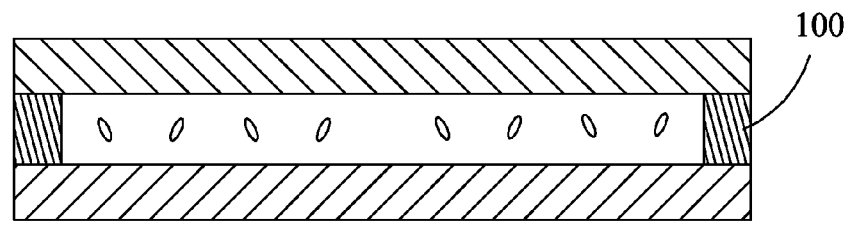
FIG. 1 is a cross-sectional view showing a conventional liquid crystal display panel.
Figure 2:
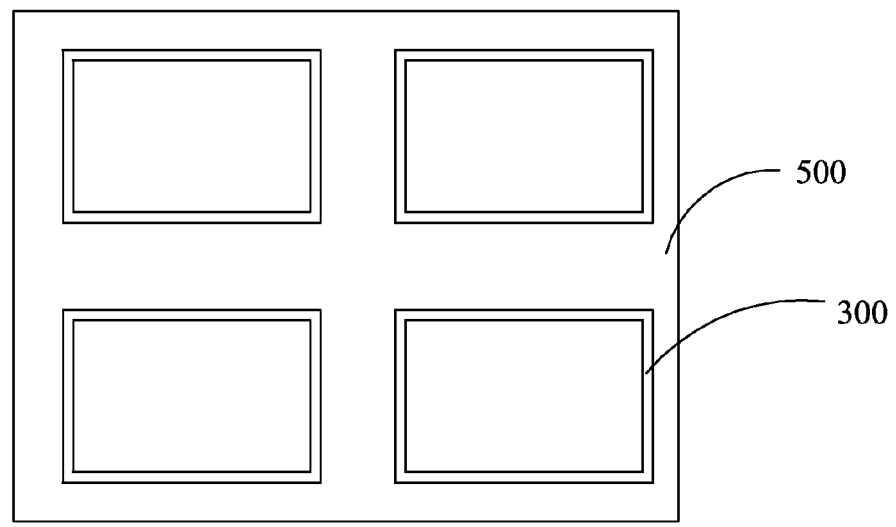
FIG. 2 is a schematic view showing the structure of a conventional light-shielding mask.
Figure 3:
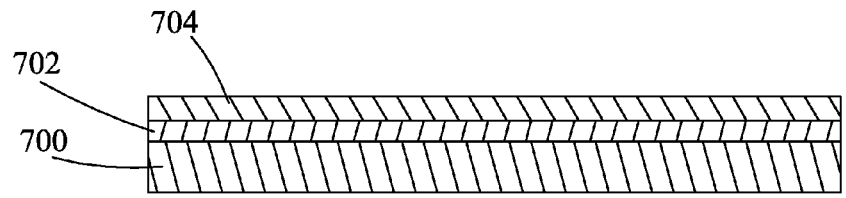
FIGS. 3-6 are schematic views illustrating a conventional process for manufacturing a light-shielding mask.
Figure 4:
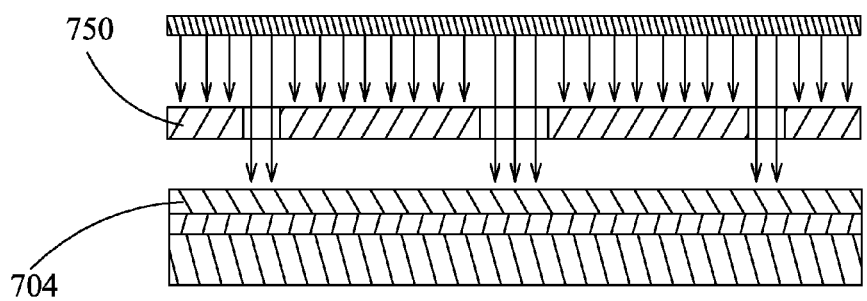
Figure 5:
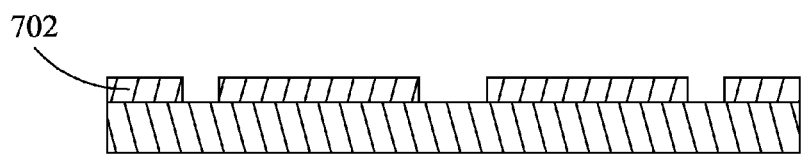
Figure 6:
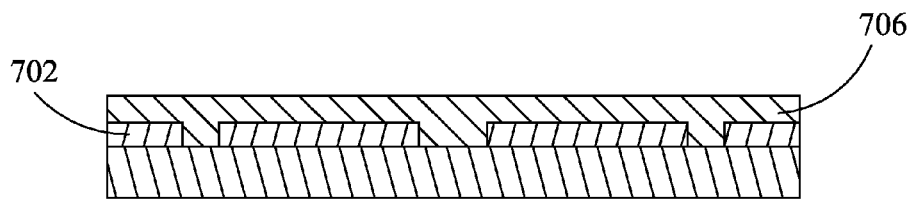
Figure 7:
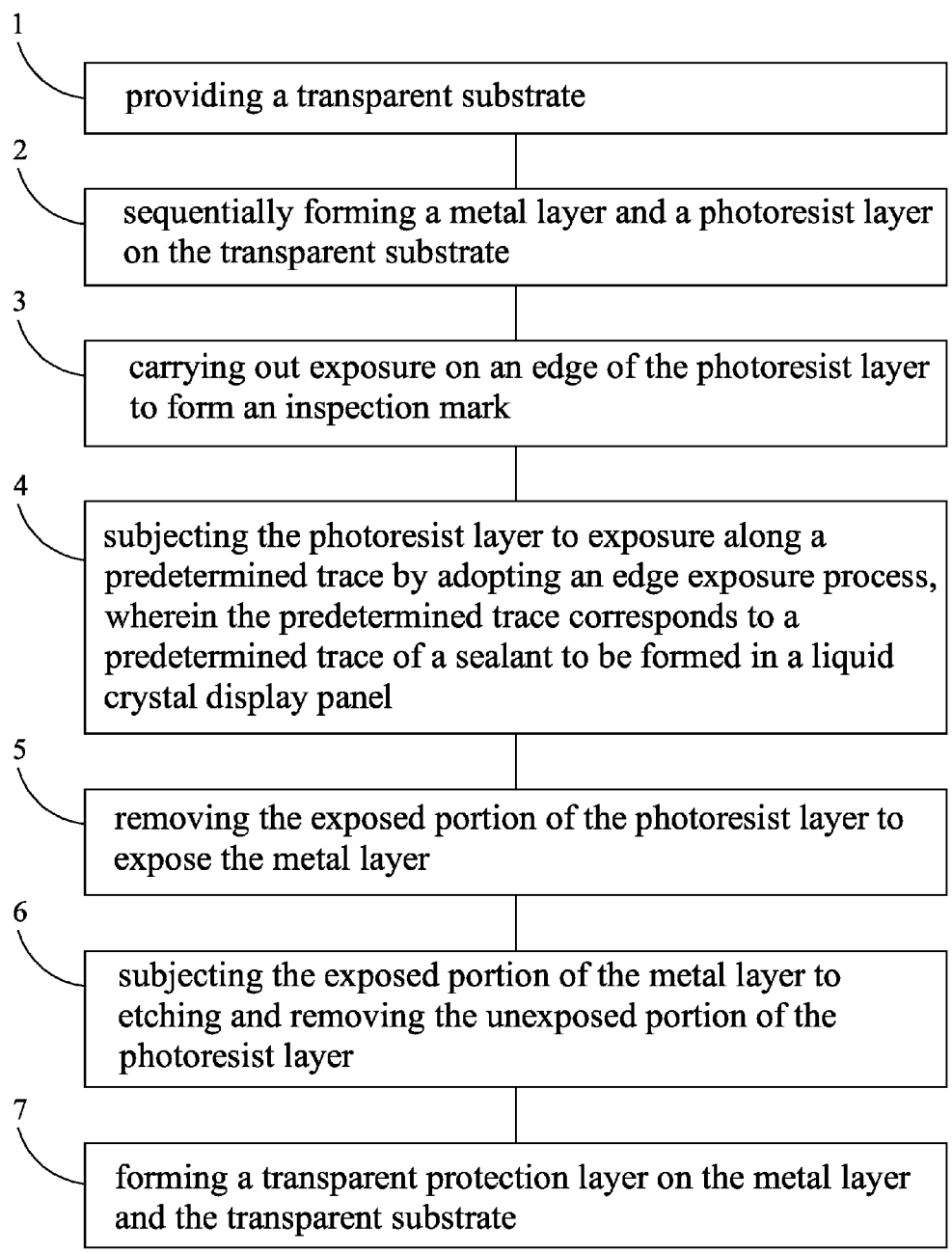
FIG. 7 is a flow chart illustrating a method for manufacturing a light-shielding mask for curing a sealant according to the present invention.

Referring to FIG. 7, the present invention provides a method for manufacturing a light-shielding mask for curing a sealant, comprising the following steps:

Step 1: providing a transparent substrate 20.

The transparent substrate 20 can be selected from a plastic substrate or a glass substrate. In the instant embodiment, the transparent substrate 20 used is a glass substrate.

Step 2: sequentially forming a metal layer 22 and a photoresist layer 24 on the transparent substrate 20.

Figure 8:
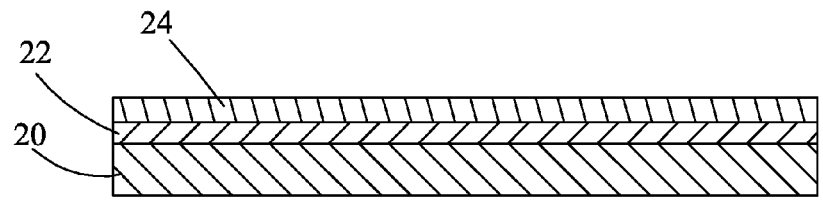
FIGS. 8-14 are schematic views illustrating the process of the method for manufacturing a light-shielding mask for curing a sealant according to the present invention.

Referring to FIG. 8, the metal layer 22 is formed on the transparent substrate 20 by means of physical vapor deposition (PVD). The photoresist layer 24 is formed on the metal layer 22 through coating.

Step 3: carrying out exposure on an edge of the photoresist layer 24 to form an inspection mark 242.

Figure 9:
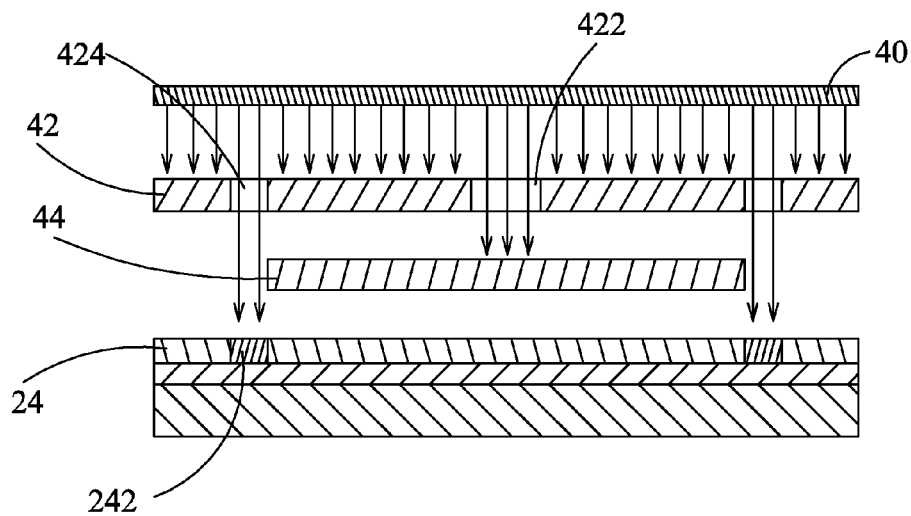

Specifically, referring to FIG. 9, step 3 comprises: providing a UV light source 40, a masking plate 42, and a shielding plate 44, wherein the masking plate 42 comprises a pattern zone 422 and a marking zone 424 located outside the pattern zone 422 and the shielding plate 44 is arranged under the pattern zone 422 so that UV light emitting from the UV light source 40 transmits through the pattern zone 422 and irradiates the shielding plate 44 and the UV light emitting from the UV light source 40 transmits through the marking zone 424 to irradiate the photoresist layer 24 on the transparent substrate 20 so as to subject the photoresist layer 24 to exposure.

Due to being shielded by the shielding plate 44, the UV light that transmits through the pattern zone 422 is prohibited from irradiating the photoresist layer 24 so that the pattern of the pattern zone 422 of the masking plate 42 is prevented from being duplicated on the photoresist layer 24 and thus, the exposure of the photoresist layer 24 is generally irrelevant to the pattern formed on the masking plate 42. As such, it only needs to select the size of the masking plate 24 to correspond to the size of the light-shielding mask to be manufactured. The problem of the prior art that manufacture can be carried out only when a masking plate on which a corresponding pattern zone is formed is provided in the conventional manufacture process can be overcome and the number of the masking plates needed can be effectively reduced, so as to reduce the material cost of manufacture and also, due to the number of the masking plates is reduced, unified management and warehousing can be realized and costs of management and warehousing can be reduced.

Step 4: subjecting the photoresist layer 24 to exposure along a predetermined trace by adopting an edge exposure process, wherein the predetermined trace corresponds to a predetermined trace of a sealant to be formed in a liquid crystal display panel.

Figure 10:
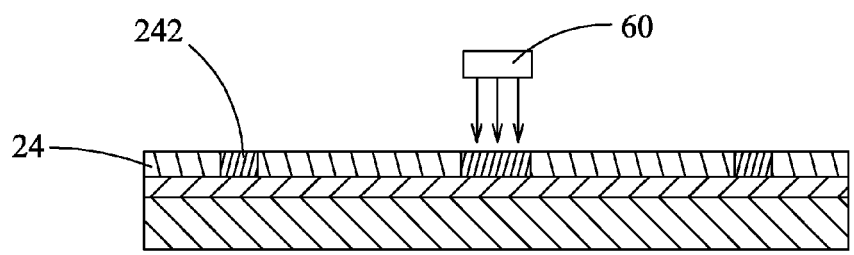

Specifically, referring to FIG. 10, step 4 comprises: providing edge exposure facility 60 and carrying out exposure of the photoresist layer 24 along the predetermined trace. In the instant embodiment, the edge exposure facility 60 comprises an edge exposure device.

The edge exposure device applies an exposure operation on the photoresist layer 24 along the predetermined trace to form a predetermined pattern. Such a process is just like using the edge exposure device to make a drawing on the photoresist layer 24 along the predetermined trace to form the predetermined pattern.

Step 5: removing the exposed portion of the photoresist layer 24 to expose the metal layer 22.

Figure 11:
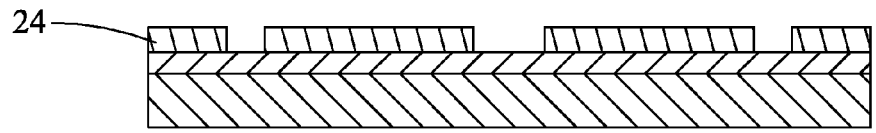

Referring to FIG. 11, the exposed portion of the photoresist layer 24 is removed and the metal layer 22 is exposed.

Step 6: subjecting the exposed portion of the metal layer 22 to etching and removing the unexposed portion of the photoresist layer 24.

Figure 12:
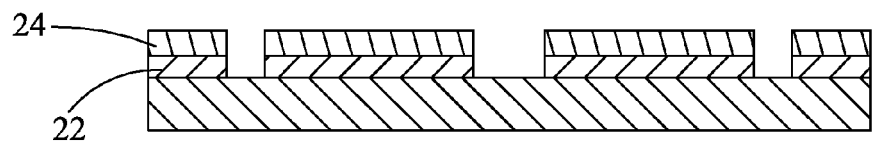
Figure 13:
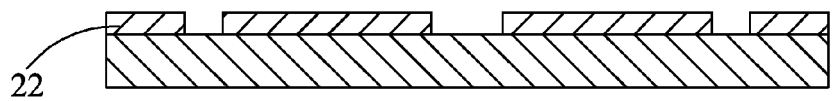

Referring to FIGS. 12 and 13, the etching applied can be either one of dry etching and wet etching or a combination thereof. In a specific operation, a desired method of etching can be selected according to the material of the metal layer 22 used.

Step 7: forming a transparent protection layer 26 on the metal layer 22 and the transparent substrate 20.

Figure 14:
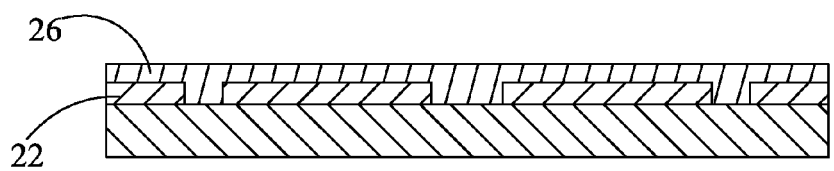

Referring to FIG. 14, the transparent protection layer 26 is made of a non-metallic material and is formed through chemical vapor deposition to protect the metal layer 22 so as to avoid oxidation or corrosion of the metal layer 22 and to extend the life span of the light-shielding mask.

In summary, the present invention provides a method for manufacturing a light-shielding mask for curing a sealant, which uses an edge exposure process to subject the photoresist layer to patternized exposure along a predetermined trace so that no specific masking plate is needed and the number of masking plates prepared can be effectively reduced, thereby reducing the cost the material for manufacture. Further, due to the number of the masking plates is reduced, unified management and warehousing can be realized and costs of management and warehousing can be reduced.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a light-shielding mask for curing a sealant, comprising the following steps:
   (1) providing a transparent substrate;
   (2) sequentially forming a metal layer and a photoresist layer on the transparent substrate;
   (3) carrying out exposure on an edge of the photoresist layer to form an inspection mark;
   (4) subjecting the photoresist layer to exposure along a predetermined trace by adopting an edge exposure process, wherein the predetermined trace corresponds to a predetermined trace of a sealant to be formed in a liquid crystal display panel;
   (5) removing the exposed portion of the photoresist layer to expose the metal layer;
   (6) subjecting the exposed portion of the metal layer to etching and removing the unexposed portion of the photoresist layer; and
   (7) forming a transparent protection layer on the metal layer and the transparent substrate;
   wherein step (3) comprises: providing a UV light source, a masking plate, and a shielding plate wherein the masking plate comprises a pattern zone and a marking zone located outside the pattern zone and the shielding plate is arranged under the pattern zone so that UV light emitting from the UV light source transmits through the pattern zone and irradiates the shielding plate and the UV light emitting from the UV light source transmits through the marking zone to irradiate the photoresist layer on the transparent substrate so as to subject the photoresist layer to exposure.

2. The method for manufacturing a light-shielding mask for curing a sealant as claimed in claim 1, wherein the transparent substrate is a glass substrate.

3. The method for manufacturing a light-shielding mask for curing a sealant as claimed in claim 1, wherein the metal layer is formed on the transparent substrate through physical vapor deposition.

4. The method for manufacturing a light-shielding mask for curing a sealant as claimed in claim 1, wherein the photoresist layer is formed on the metal layer through coating.

5. The method for manufacturing a light-shielding mask for curing a sealant as claimed in claim 1, wherein step (4) comprises: providing edge exposure facility and carrying out exposure of the photoresist layer along the predetermined trace.

6. The method for manufacturing a light-shielding mask for curing a sealant as claimed in claim 5, wherein the edge exposure facility comprises an edge exposure device.

7. The method for manufacturing a light-shielding mask for curing a sealant as claimed in claim 1, wherein the etching used comprises one of dry etching and wet etching or a combination thereof.

8. The method for manufacturing a light-shielding mask for curing a sealant as claimed in claim 1, wherein the transparent protection layer is made of a non-metallic material.

9. The method for manufacturing a light-shielding mask for curing a sealant as claimed in claim 1, wherein the transparent protection layer is formed through chemical vapor deposition.

10. A method for manufacturing a light-shielding mask for curing a sealant, comprising the following steps:
   (1) providing a transparent substrate;
   (2) sequentially forming a metal layer and a photoresist layer on the transparent substrate;
   (3) carrying out exposure on an edge of the photoresist layer to form an inspection mark;

(4) subjecting the photoresist layer to exposure along a predetermined trace by adopting an edge exposure process, wherein the predetermined trace corresponds to a predetermined trace of a sealant to be formed in a liquid crystal display panel;
(5) removing the exposed portion of the photoresist layer to expose the metal layer;
(6) subjecting the exposed portion of the metal layer to etching and removing the unexposed portion of the photoresist layer; and
(7) forming a transparent protection layer on the metal layer and the transparent substrate;

wherein the transparent substrate is a glass substrate;

wherein the metal layer is formed on the transparent substrate through physical vapor deposition;

wherein the photoresist layer is formed on the metal layer through coating;

wherein step (3) comprises: providing a UV light source, a masking plate, and a shielding plate, wherein the masking plate comprises a pattern zone and a marking zone located outside the pattern zone and the shielding plate is arranged under the pattern zone so that UV light emitting from the UV light source transmits through the pattern zone and irradiates the shielding plate and the UV light emitting from the UV light source transmits through the marking zone to irradiate the photoresist layer on the transparent substrate so as to subject the photoresist layer to exposure; and wherein step (4) comprises: providing edge exposure facility and carrying out exposure of the photoresist layer along the predetermined trace.

11. The method for manufacturing a light-shielding mask for curing a sealant as claimed in claim 10, wherein the edge exposure facility comprises an edge exposure device.

12. The method for manufacturing a light-shielding mask for curing a sealant as claimed in claim 10, wherein the etching used comprises one of dry etching and wet etching or a combination thereof.

13. The method for manufacturing a light-shielding mask for curing a sealant as claimed in claim 10, wherein the transparent protection layer is made of a non-metallic material.

14. The method for manufacturing a light-shielding mask for curing a sealant as claimed in claim 10, wherein the transparent protection layer is formed through chemical vapor deposition.

* * * * *